(12) United States Patent
Ibe et al.

(10) Patent No.: US 9,777,079 B2
(45) Date of Patent: Oct. 3, 2017

(54) RESIN COMPOSITION, DRY-ETCHING RESIST MASK, AND PATTERNING METHOD

(71) Applicant: DIC Corporation, Tokyo (JP)

(72) Inventors: Takeshi Ibe, Sakura (JP); Makoto Yada, Sakura (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 15/035,897

(22) PCT Filed: Dec. 17, 2014

(86) PCT No.: PCT/JP2014/083447
§ 371 (c)(1),
(2) Date: May 11, 2016

(87) PCT Pub. No.: WO2015/098662
PCT Pub. Date: Jul. 2, 2015

(65) Prior Publication Data
US 2016/0272737 A1 Sep. 22, 2016

(30) Foreign Application Priority Data
Dec. 25, 2013 (JP) .................................. 2013-267015

(51) Int. Cl.
| | |
|---|---|
| *B29C 59/02* | (2006.01) |
| *C08F 12/36* | (2006.01) |
| *H01L 21/311* | (2006.01) |
| *C08F 12/34* | (2006.01) |
| *C08F 257/00* | (2006.01) |
| *C08K 5/00* | (2006.01) |
| *C08L 101/02* | (2006.01) |
| *C08F 12/32* | (2006.01) |
| *C09D 125/16* | (2006.01) |
| *G03F 7/00* | (2006.01) |

(52) U.S. Cl.
CPC ............ *C08F 12/36* (2013.01); *B29C 59/026* (2013.01); *C08F 12/32* (2013.01); *C08F 12/34* (2013.01); *C08F 257/00* (2013.01); *C08K 5/00* (2013.01); *C08L 101/02* (2013.01); *C09D 125/16* (2013.01); *G03F 7/0002* (2013.01); *H01L 21/31144* (2013.01); *B81C 2201/0153* (2013.01)

(58) Field of Classification Search
CPC .... G03F 7/0002; B81C 2201/015–2201/0153; B29C 35/0288
See application file for complete search history.

(56) References Cited

U.S. PATENT DOCUMENTS

| | | | | |
|---|---|---|---|---|
| 4,528,332 | A | * | 7/1985 | Ai .............................. C08F 8/08 430/280.1 |
| 5,202,402 | A | * | 4/1993 | Funaki .................. C08F 212/08 526/159 |
| 2006/0214330 | A1 | * | 9/2006 | Dumond ............. B81C 99/0085 264/320 |

FOREIGN PATENT DOCUMENTS

| | | | |
|---|---|---|---|
| GB | 2196639 | A * | 5/1988 |
| JP | 01-263646 | A * | 10/1989 |

OTHER PUBLICATIONS

English translation of JP 01-263646 a obtained from STIC a machine translation of the document obtained using the J-PLAT system from the Japanese Patent Office, with abstract then translation starting on p. 3, 14 pages.*
STN abstract thereof with registry substance identifiers attached thereto of JP 01-263646, obtained Oct. 17, 2016, Accession No. 1990:431991, CAN 113:31991, CAPLUS, 97 pages.*
D'alelio et al "Linear Polymers of Vinyl Aryl Monomers Containing Another Unsaturated Group", Journal of Polymer Science: Part A-1 vol. 5, 1245-1264 (1967).*
H. Gokan et al., "Dry Etch Resistance of Organic Materials," J. Electrochem. Soc. 143, 130 (1983), pp. 143-146.

* cited by examiner

*Primary Examiner* — Cynthia Hamilton
(74) *Attorney, Agent, or Firm* — Locke Lord LLP

(57) ABSTRACT

Provided is a curable resin composition for a dry-etching resist, the curable resin composition containing a polymer (A) having, in a side chain, a particular structure including an aromatic group having a vinyl group. The polymer (A) includes 80 to 100 wt % of the particular structure. In addition, provided are a dry-etching resist mask obtained by curing the curable composition for a dry-etching resist, and the dry-etching resist mask having a pattern formed by a nanoimprint method.

4 Claims, No Drawings

RESIN COMPOSITION, DRY-ETCHING RESIST MASK, AND PATTERNING METHOD

TECHNICAL FIELD

The present invention provides a dry-etching resist material that achieves good dry etching performance and precise pattern reproducibility.

BACKGROUND ART

In recent years, electronic materials, such as semiconductors and LEDs, have become more compact and finer with the trend toward higher integration. In particular, there has been a strong demand for techniques of producing nanometer-scale patterns, which are finer than micrometer-scale patterns.

There are various methods for producing fine patterns, and etching using masks has been most commonly used. Of etching techniques, dry etching is often used to form highly fine patterns because of its high etching precision.

In order to increase the reproducibility of patterns to be transferred and the etching rate, resists to be used need to have high dry-etching resistance. For example, in NPL 1, it is disclosed that dry etching performance varies depending on the ratio between the number of carbon atoms and the number of other atoms, which is called the Ohnishi parameter, and examples of resins providing high dry etching performance include polystyrene. However, polystyrene has good dry-etching resistance but has no curability and hence it has been difficult to form highly fine patterns with polystyrene.

Curable compositions including a compound having a (meth)acryloyl group have been often used as a resist with which highly fine patterns can be formed. Curable compositions including a compound having a (meth)acryloyl group provide good pattern formability but have a problem of low dry etching performance because such curable compositions contain oxygen in the molecule thereof.

CITATION LIST

Non Patent Literature

NPL 1: J. Electrochem. Soc. 143, 130 (1983) H. Gokan, S. Esho and Y. Ohnishi

SUMMARY OF INVENTION

Technical Problem

An object of the present invention is to provide a resin composition that is a dry-etching resist material which provides good dry etching performance, with which highly fine patterns can be formed, and which provides good transfer reproducibility.

Solution to Problem

As a result of diligent studies by the inventors, it has been found that the object can be achieved by using a polymer (A) having a particular structure.

That is, the present invention provides a curable resin composition for a dry-etching resist. The curable resin composition contains a polymer (A) having a structure represented by a formula (a-1) below. The polymer (A) includes 80 to 100 wt % of the structure represented by the formula (a-1).

[Chem. 1]

(a-1)

(In the formula (a-1), X is a structural unit represented by X1 or X2, X1 is represented by a formula (a-2) below, and X2 is represented by a formula (a-3) below, when the number of X1 is m and the number of X2 is n in the polymer (A), m is an integer of 3 or more, n is an integer of 0 or 1 or more, and m/(m+n) ranges from 0.2 to 1, and p represents an integer of 3 to 2000.

[Chem. 2]

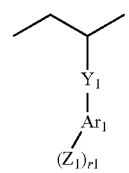
(a-2)

(In the formula (a-2), $Ar_1$ represents an aromatic group having at least one aromatic ring, $Y_1$ is a single bond or a divalent linking group including a C1 to C3 hydrocarbon group, $Z_1$ is a hydrocarbon group having at least one vinyl group, and r1 represents an integer of 1 to 5.)

[Chem. 3]

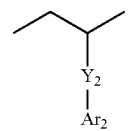
(a-3)

(In the formula (a-3), $Ar_2$ represents an aromatic group having at least one aromatic ring, and $Y_2$ is a single bond or a divalent linking group including a C1 to C3 hydrocarbon group.))

The present invention also provides the curable resin composition for a dry-etching resist according to claim 1, wherein X1 in the formula (a-1) is represented by a formula (a-4) below.

[Chem. 4]

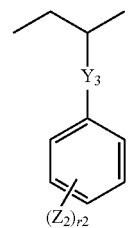
(a-4)

($Y_3$ is a single bond or a divalent linking group including a C1 to C3 hydrocarbon group, $Z_2$ is a hydrocarbon group having at least one vinyl group, and r2 represents an integer of 1 to 5.)

The present invention also provides the curable resin composition for a dry-etching resist according to claim 1 or 2, wherein X2 in the formula (a-1) is represented by a formula (a-5) below.

[Chem. 5]

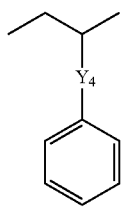

(a-5)

(In the formula (a-5), Y$_4$ represents a single bond or a divalent linking group including a C1 to C3 hydrocarbon group.

The present invention also provides the curable resin composition for a dry-etching resist, wherein the polymer (A) has a molecular weight of 300 to 100,000.

The present invention also provides the curable resin composition for a dry-etching resist, wherein the milliequivalent of the vinyl group per gram of the polymer (A) is 1.8 to 12.8 meq/g.

The present invention also provides the curable resin composition for a dry-etching resist, the composition further comprising a polymerizable monomer (B).

The present invention also provides the curable resin composition for a dry-etching resist, wherein the resin composition has an Ohnishi parameter of 3.2 or less.
(It is noted that the Ohnishi parameter here is represented by $N/(N_C-N_O)$ where N is the total number of atoms, $N_C$ is the total number of carbon atoms, and $N_O$ is the total number of oxygen atoms in the solid content of the resin composition.)

The present invention also provides a dry-etching resist mask obtained by curing the curable resin composition for a dry-etching resist.

The present invention also provides the dry-etching resist mask having a pattern formed by a nanoimprint method.

The present invention also provides a pattern transfer method including:
a step of pressing a mold against the resin composition for a dry-etching resist;
a step of providing a cured product having a pattern by curing the curable resin composition for a dry-etching resist to form the pattern; and
a step of transferring the pattern to a workpiece by performing dry etching using as a resist mask the obtained cured product having the pattern.

Advantageous Effects of Invention

A resin composition for a dry-etching resist according to the present invention provides a dry-etching resist mask that provides good dry etching performance and also achieves good formability and reproducibility of highly fine patterns as in nanoimprinting.

DESCRIPTION OF EMBODIMENTS

[Polymer (A)]
A curable resin composition for a dry-etching resist according to the present invention has a polymer (A) having a structure represented by a formula (a-1) below.

[Chem. 6]

(a-1)

(In the formula (a-1), X is a structural unit represented by X1 or X2, X1 is represented by a formula (a-2) below, and X2 is represented by a formula (a-3) below,
when the number of X1 is m and the number of X2 is n in the polymer (A), m is an integer of 3 or more, n is an integer of 0 or 1 or more, and m/(m+n) ranges from 0.2 to 1, and p represents an integer of 3 to 2000.

[Chem. 7]

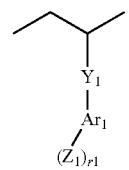

(a-2)

(In the formula (a-2), Ar$_1$ represents an aromatic group having at least one aromatic ring, Y$_1$ is a single bond or a divalent linking group including a C1 to C3 hydrocarbon group, Z$_1$ is a hydrocarbon group having at least one vinyl group, and r1 represents an integer of 1 to 5.)

[Chem. 8]

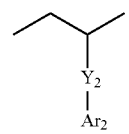

(a-3)

(In the formula (a-3), Ar$_2$ represents an aromatic group having at least one aromatic ring, and Y$_2$ is a single bond or a divalent linking group including a C1 to C3 hydrocarbon group.)

In the polymer (A), X1 and X2 are structural units represented by the formulas (a-2) and (a-3), respectively, and these structural units may be present alone or in combination in the polymer (A) as long as the structural units has the structures represented by the formulas (a-2) and (a-3), respectively.

In the formulas (a-2) and (a-3), the aromatic groups having at least one aromatic ring and represented by Ar$_1$ and Ar$_2$ may include a heteroatom, but preferably include no heteroatom from the standpoint of dry etching performance. Specific examples of the aromatic group include groups having structures represented by the following formulas, such as a phenyl group, a naphthyl group, an anthryl group, a phenanthryl group, and a pyrenyl group. These aromatic groups may have a substituent, but preferably have no substituent.

[Chem. 9]

(Ar-I)

-continued

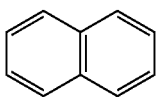
(Ar-II)

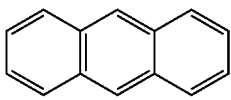
(Ar-III)

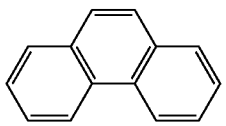
(Ar-IV)

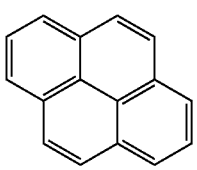
(Ar-V)

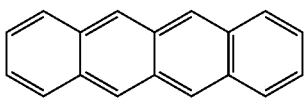
(Ar-VI)

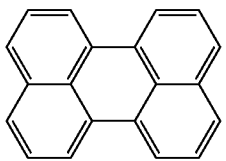
(Ar-VII)

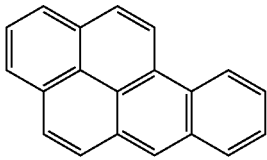
(Ar-VIII)

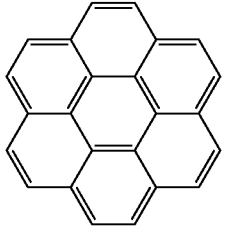
(Ar-IX)

When the aromatic groups having at least one aromatic ring and represented by $Ar_1$ and $Ar_2$ have a substituent, examples of the substituent include halogen atoms, optionally substituted C1 to C20 alkyl groups, optionally substituted aryl groups, and optionally substituted aralkyl groups, and preferred examples are substituents that do not degrade dry-etching resistance, such as a phenyl group, a benzyl group, a cyclohexyl group, and an adamantyl group. These substituents may be bonded to each other to form a cyclic structure.

The structural unit X1 represented by the formula (a-2) has a hydrocarbon group having at least one vinyl group and represented by $Z_1$. The hydrocarbon group having a vinyl group may be a hydrocarbon group in which the vinyl group directly has a substituent, such as a vinylidene group and a vinylene group. Specific examples of the hydrocarbon group include a vinyl group, a 1-propenyl group, an allyl group, an isopropenyl group, a 1-butenyl group, a 2-butenyl group, a methallyl group, a butadienyl group, a styryl group, an α-methyl styryl group, a cyclohexenyl group, an indenyl group, and a vinylnaphthyl group. A vinyl group is preferred.

The structural unit X1 represented by the formula (a-2) has a single bond or a divalent linking group including a C1 to C3 hydrocarbon group, the single bond or the divalent linking group being represented by $Y_1$. $Y_1$ may include a heteroatom, but is preferably a hydrocarbon group including no heteroatom from the standpoint of dry etching performance. The smaller the number of carbon atoms is, the more preferred the hydrocarbon group is. Specific examples include a methylene group, an ethylene group, and a propylene group. A single bond is most preferred.

The structural unit X2 represented by the formula (a-3) has a single bond or a divalent linking group including a C1 to C3 hydrocarbon group, the single bond or the divalent linking group being represented by $Y_2$. $Y_1$ may include a heteroatom, but is preferably a hydrocarbon group including no heteroatom from the standpoint of dry etching performance. The smaller the number of carbon atoms is, the more preferred the hydrocarbon group is. Specific examples include a methylene group, an ethylene group, and a propylene group. A single bond is most preferred.

X1 and X2 may have a substituent and, for example, X1 may have a structure of a formula (a-2-2) and X2 may have a structure of a formula (a-3-2). In the formulas, a substituent represented by R may be independently the same, or the substituent may be partially a hydrogen atom.

[Chem. 10]

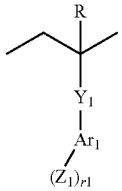

(a-2-2)

(Examples of R include a hydrogen atom, halogen atoms, optionally substituted C1 to C10 alkyl groups, and optionally substituted aryl groups, $Ar_1$ represents an aromatic group having at least one aromatic ring, $Y_1$ is a single bond or a divalent linking group including a C1 to C3 hydrocarbon group, $Z_1$ is a hydrocarbon group having at least one vinyl group, and r1 represents an integer of 1 to 5.)

[Chem. 11]

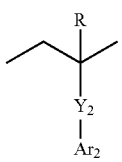

(a-3-2)

(Examples of R include a hydrogen atom, halogen atoms, optionally substituted C1 to C10 alkyl groups, and optionally substituted aryl groups, $Ar_2$ represents an aromatic group having at least one aromatic ring, and $Y_2$ is a single bond or a divalent linking group including a C1 to C3 hydrocarbon group.)

Examples of the structural unit X1 include those having the following structures.
[Chem. 12]
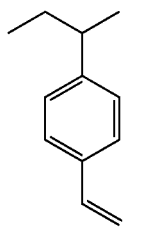
(X1-1)
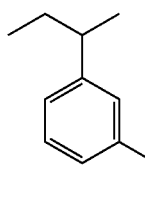
(X1-2)
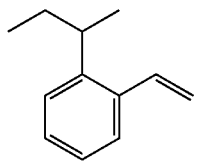
(X1-3)
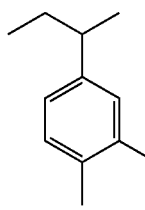
(X1-4)
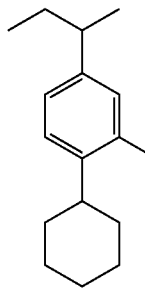
(X1-5)
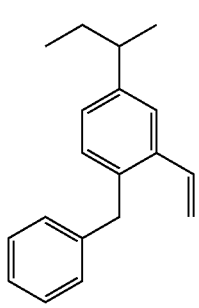
(X1-6)
-continued
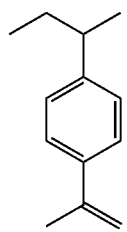
(X1-7)
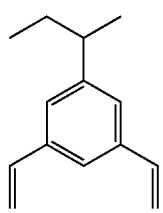
(X1-8)
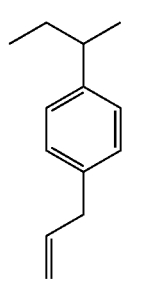
(X1-9)
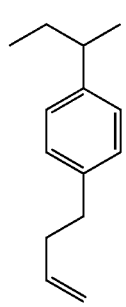
(X1-10)
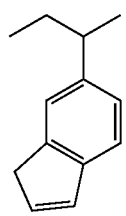
(X1-11)
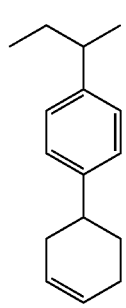
(X1-12)

(X1-13)
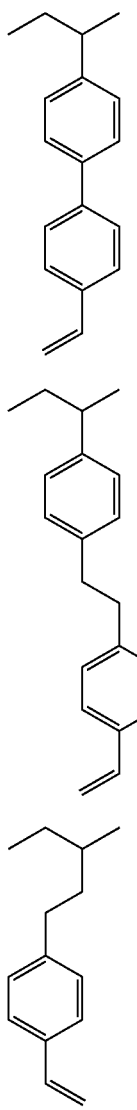
(X1-14)
(X1-15)
(X1-16)
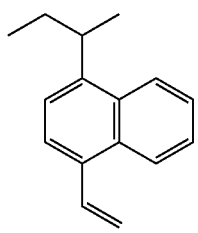
(X1-17)
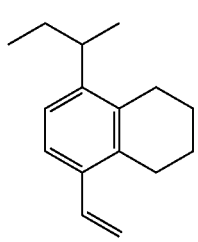
(X1-18)
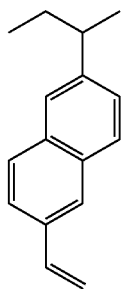
(X1-19)
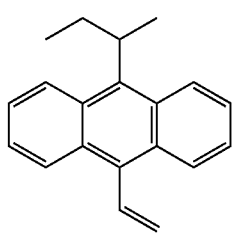
(X1-20)
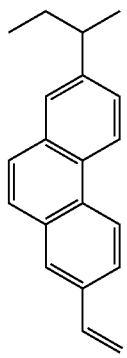
Examples of the structural unit X2 include those having the following structures.
[Chem. 13]
(X2-1)
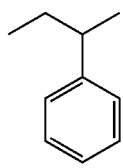
(X2-2)
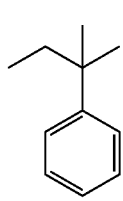
(X2-3)
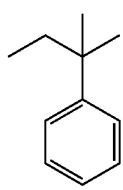

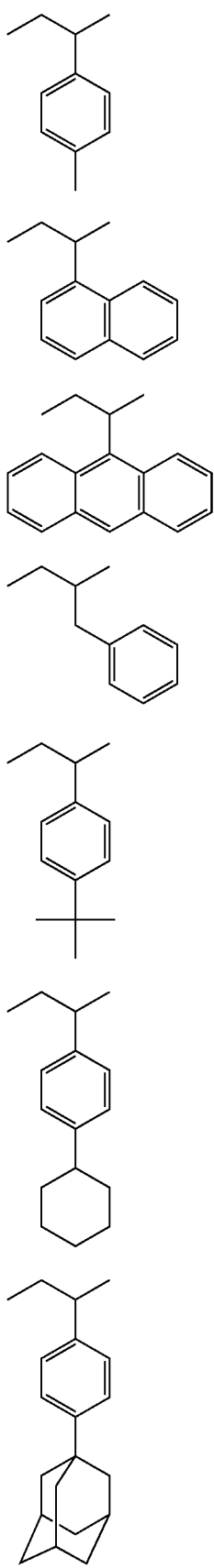
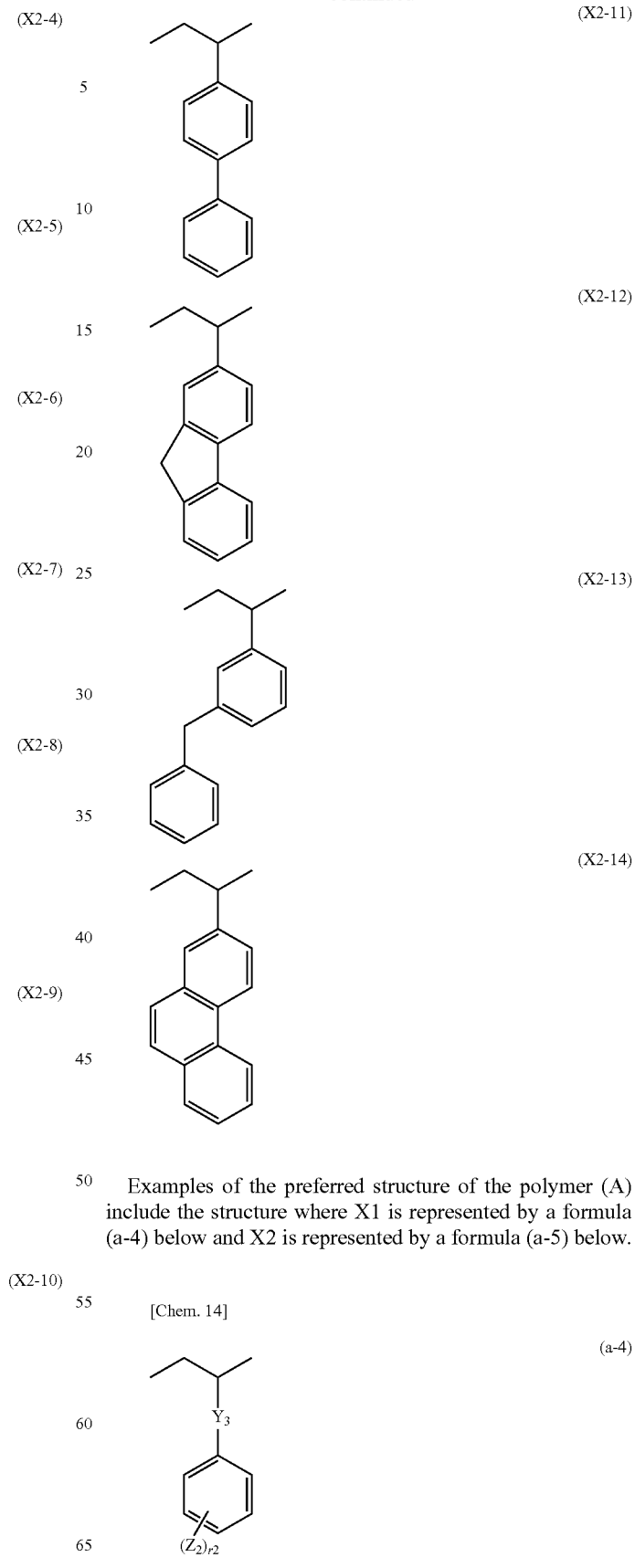
Examples of the preferred structure of the polymer (A) include the structure where X1 is represented by a formula (a-4) below and X2 is represented by a formula (a-5) below.
[Chem. 14]
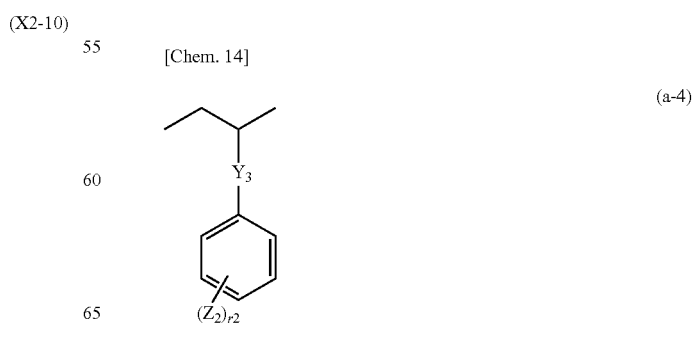

(In the formula (a-4), $Y_3$ is a single bond or a divalent linking group including a C1 to C3 hydrocarbon group, $Z_2$ is a hydrocarbon group having at least one vinyl group, and r2 represents an integer of 1 to 5.)

[Chem. 15]

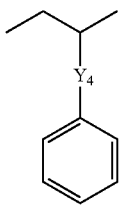

(a-5)

(In the formula (a-5), $Y_4$ represents a single bond or a divalent linking group including a C1 to C3 hydrocarbon group.)

A particularly preferred polymer (A) is a divinylbenzene polymer, in which X has only the structure represented by the formula (a-4).

[Chem. 16]

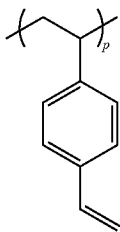

(a-6)

The molecular weight of the polymer (A) of the present invention is preferably 300 to 100,000. A molecular weight of 100,000 or less is preferred because the polymer (A) provides good pattern formability.

The milliequivalent of the vinyl group per gram of the polymer (A) (meq/g) in the polymer (A) of the present invention is preferably 1.8 to 12.8 meq/g. This is because a milliequivalent of 1.8 meq/g or more provides good curability and a milliequivalent of 12.8 meq/g or less allows relatively easy synthesis of the polymer (A).

The milliequivalent of the vinyl group per gram of the polymer (A) (meq/g) in the present invention can be calculated according to the following calculation formula.

(1/[the molecular weight of the polymer(A)])×[the number of the vinyl group per molecule of the polymer(A)]×1000

As used herein, the term "the molecular weight of the polymer (A)" refers to the theoretical calculated molecular weight of the polymer (A), and the term "the number of the vinyl group per molecule of the polymer (A)" refers to the theoretical number of the vinyl group per molecule of the polymer (A).

The polymer (A) of the present invention is characterized in that the polymer (A) includes 80 to 100 wt % of the structure represented by the formula (a-1). At 80 wt % or more, a dry-etching resist that achieves good dry etching performance and fine pattern formability is provided. At this time, the polymer (A) may include any structure in addition to the structure represented by the formula (a-1). For example, the polymer (A) may be bonded to a polymerization initiator or may be bonded to, for example, a hydrocarbon group or a functional group having a heteroatom as long as advantageous effects of the present invention are not impaired.

[Curable Resin Composition for Dry-Etching Resist]

A curable resin composition for a dry-etching resist according to the present invention contains the polymer (A). Since the polymer (A) of the present invention is a compound having multiple aromatic rings and provides good dry-etching resistance and furthermore the polymerizable group in the polymer (A) is a vinyl group, the polymer (A) achieves better dry-etching resistance than polymers having a heteroatom-containing polymerizable group, such as a (meth)acryloyl group. In the case of a monomer or dimer having an aromatic structure and having a vinyl group, such as divinylbenzene, the cured product has insufficient toughness because of the low reactivity of the vinyl group and hence pattern damage or the like may occur during dry etching. Since the polymer (A) of the present invention has three or more vinyl groups and thus has good reactivity, the polymer (A) contributes to good pattern reproducibility and good pattern transferability.

The resin composition of the present invention may contain a polymerizable monomer (B) in addition to the polymer (A). The polymerizable monomer (B) is preferably an active energy ray-curable monomer and preferably contains a polyfunctional (meth)acrylate. A publicly known polyfunctional (meth)acrylate can be used without any limitation. Examples of the polyfunctional (meth)acrylate include polyfunctional (meth)acrylates having two or more polymerizable double bonds per molecule, such as 1,2-ethanediol diacrylate, 1,2-propanediol diacrylate, 1,4-butanediol diacrylate, 1,6-hexanediol diacrylate, dipropylene glycol diacrylate, neopentyl glycol diacrylate, tripropylene glycol diacrylate, trimethylolpropane diacrylate, trimethylolpropane triacrylate, Tris-(2-acryloyloxy) isocyanurate, pentaerythritol triacrylate, pentaerythritol tetraacrylate, di(trimethylolpropane) tetraacrylate, di(pentaerythritol) pentaacrylate, and di(pentaerythritol) hexaacrylate. Examples of the polyfunctional acrylate include urethane acrylates, polyester acrylates, and epoxy acrylates. These may be used alone or in combination of two or more.

A dispersion medium may be used for the resin composition of the present invention in order to adjust the solid content and the viscosity of the resin composition. The dispersion medium is any liquid medium that does not impair advantageous effects of the present invention, and examples of the dispersion medium include various organic solvents and liquid organic polymers.

Examples of the organic solvents include ketones, such as acetone, methyl ethyl ketone (MEK), methyl isobutyl ketone (MIBK), and cyclohexanone; cyclic ethers, such as tetrahydrofuran (THF) and dioxolane; esters, such as methyl acetate, ethyl acetate, butyl acetate, and propylene glycol monomethyl ether acetate; aromatic compounds, such as toluene, xylene, and anisole; and alcohols, such as carbitol, cellosolve, methanol, isopropanol, butanol, and propylene glycol monomethyl ether. These organic solvents can be used alone or in combination. Of these, methyl isobutyl ketone is preferred from the standpoint of volatility during coating and solvent recovery.

The liquid organic polymer is a liquid organic polymer that does not directly contributes to curing reactions. Examples of the liquid organic polymer include a carboxyl group-containing modified polymer (FLOWLEN G-900, NC-500: Kyoeisha Chemical Co., Ltd.), an acrylic polymer (FLOWLEN WK-20: Kyoeisha Chemical Co., Ltd.), an amine salt of special modified phosphate (HIPLAAD ED-251: Kusumoto Chemicals, Ltd.), and a modified acrylic block copolymer (DISPERBYK 2000; BYK Chemie).

The resin composition of the present invention may contain, for example, various resins, a reactive compound, a catalyst, a polymerization initiator, an organic filler, an inorganic filler, an organic solvent, an inorganic pigment, an organic pigment, an extender pigment, a clay mineral, a wax, a surfactant, a stabilizer, a flowability modifier, a dye, a leveling agent, a rheology controlling agent, an ultraviolet absorber, an antioxidant, and a plasticizer, as long as advantageous effects of the present invention are not impaired.

[Curing]

Since the curable resin composition for a dry-etching resist according to the present invention has vinyl groups, the curable resin composition can be cured by irradiation with active energy rays and is preferably cured by ultraviolet rays. At this time, the curable resin composition for a dry-etching resist preferably contains a photopolymerization initiator. A publicly known photopolymerization initiator may be used and, for example, at least one selected from the group consisting of acetophenones, benzyl ketals, and benzophenones can be preferably used. Examples of the acetophenones include diethoxy acetophenone, 2-hydroxy-2-methyl-1-phenylpropan-1-one, 1-(4-isopropylphenyl)-2-hydroxy-2-methylpropan-1-one, and 4-(2-hydroxyethoxyl)phenyl-(2-hydroxy-2-propyl)ketone. Examples of the benzyl ketals include 1-hydroxycyclohexyl-phenyl ketone and benzyl dimethyl ketal. Examples of the benzophenones include benzophenone and methyl o-benzoylbenzoate. Examples of the benzoins include benzoin, benzoin methyl ether, and benzoin isopropyl ether. The photopolymerization initiator may be used alone or in combination of two or more.

Use of a sensitizing dye in combination with the photopolymerization initiator can significantly improve photosensitivity. Specific examples of the sensitizing dye include dyes, such as thioxanthene dyes, xanthene dyes, ketone dyes, thiopyrylium salt dyes, base styryl dyes, merocyanine dyes, 3-substituted coumarin dyes, cyanine dyes, acridine dyes, and thiazine dyes.

Examples of light sources to be used during ultraviolet curing include a low-pressure mercury lamp, a high pressure mercury lamp, a metal halide lamp, a xenon lamp, an argon laser, a helium-cadmium laser, and an ultraviolet light emitting diode.

[Resist Film]

The curable resin composition for a dry-etching resist according to the present invention is stacked on a substrate and cured to provide a resist film and a stacked product having the resist film.

As a method for forming the resist film, a publicly known method may be used. For example, the resist film can be formed by applying a resist liquid, which is a liquid curable resin composition for a dry-etching resist, to the surface of a substrate and curing the resist liquid. When such a liquid curable resin composition for a dry-etching resist is used, the total solid content in the dry-etching resist material is preferably 0.1 mass % or more and 20 mass % or less, more preferably 0.4 mass % or more and 5 mass % or less, and still more preferably 0.7 mass % or more and 2 mass % or less in consideration of coating properties (for example, the film thickness after coating and after solvent removal falls in a desired range; the film thickness is uniform over the entire target surface; and even if the target surface has some unevenness, the coating film with a uniform thickness is formed in conformity with the unevenness) and the like. Specifically, the film thickness of the coating film may be adjusted to 0.01 to 50 μm, and more preferably 0.02 to 35 μm.

Since the curable resin composition for a dry-etching resist according to the present invention allows fine pattern processing, the film thickness can be 1 μm or less.

The resist film of the present invention may be obtained as follows: a film is formed by using the curable resin composition for a dry-etching resist according to the present invention by a publicly known formation method, such as extrusion, or the curable resin composition is applied to a temporary support film and dried; and if necessary, the surface of the formed photocurable composition layer is covered with a coating film; and the resulting layer is stacked on the target surface by heat pressing. Examples of the temporary support film used at this time include films publicly known in the related art, such as a polyethylene terephthalate film, a polyimide film, a polyamideimide film, a polypropylene film, and a polystyrene film. When such a film at this time has solvent resistance, thermal resistance, and the like, which are required during production of the resist film, the resist film of the present invention can be produced by directly applying the resist material of the present invention to the temporary support film and drying the resist material. When such a film has low solvent resistance, low thermal resistance, and the like, the resist film of the present invention can also be produced by, for example, first forming the resist material of the present invention on a film having releasability, such as a polytetrafluoroethylene film or a release film, then stacking a temporary support film having low solvent resistance, low thermal resistance, and the like on the layer of the resist material, and removing the film having releasability after an appropriate time.

The resist film of the present invention may also be formed of a coating film formed by applying the curable resin composition for a dry-etching resist according to the present invention to the target surface and removing a solvent by evaporation. Examples of the application method include a spraying method, a spin coating method, a dipping method, a roll coating method, a blade coating method, a doctor roll method, a doctor blade method, a curtain coating method, a slit coating method, and a screen printing method. A spin coating method is preferably used from the standpoint of high productivity and easy control of the film thickness.

[Stacked Product]

A stacked product of the present invention is a stacked product in which the resist film of the present invention is stacked on a substrate. The substrate to be used depends on the purpose of the resist film of the present invention, and examples of the substrate include those formed of quartz, sapphire, glass, an optical film, a ceramic material, a vapor-deposited film, a magnetic film, and a reflective film; metal substrates, such as those formed of Al, Ni, Cu, Cr, Fe, and stainless steel; those formed of a screen mesh, paper, wood, synthetic resins such as silicone, SOG (spin on glass); polymer substrates, such as a polyester film, a polycarbonate film, and a polyimide film; a TFT array substrate; light emitting diode (LED) substrates, such as those formed of sapphire and GaN; a glass substrate and a transparent plastic substrate; conductive substrates formed of indium tin oxide (ITO), metals, and the like; insulating substrates; and substrates for producing semiconductors, such as silicon, silicon nitride, polysilicone, silicon oxide, and amorphous silicon. These may be optically transparent or optically nontransparent.

The shape of the substrate is not limited, and the substrate may have a given shape according to the purpose, such as a flat plate-like shape, a sheet-like shape, or an entirely or partially curved three-dimensional shape. The hardness, the thickness, and the like of the substrate are not limited either.

A resist underlayer film made of a synthetic resin or the like may be stacked on the substrate in advance, and the substrate can also be used for multiple layers of resists.

[Patterning Method]

The resist film in the present invention can be patterned by various methods. For example, a photoresist method, such as a photolithography method or a laser direct writing method, may be used. Alternatively, a patterned mold is pressed against the resist film before curing, and the resist film is cured in this state to form a patterned resist film. The mold is then removed to form a pattern.

In an example of the lithography method, for example, the resist film before curing is stacked on the target substrate by film formation according to the foregoing method, and then exposed to active light through a mask film. Examples of light sources used during exposure include a low-pressure mercury lamp, a high pressure mercury lamp, a metal halide lamp, a xenon lamp, an argon laser, and a helium-cadmium laser. The photoirradiation dose is appropriately selected depending on the type and the amount of the photopolymerization initiator used.

In an example of the laser direct writing method, the resist film before curing is stacked by film formation according to the foregoing method and subjected to scanning exposure to laser light having a wavelength of 350 to 430 nm. Examples of the exposure light source include a carbon arc lamp, a mercury lamp, a xenon lamp, a metal halide lamp, a fluorescent lamp, a tungsten lamp, and a halogen lamp; and laser light sources, such as a HeNe laser, an argon ion laser, an YAG laser, a HeCd laser, a semiconductor laser, and a ruby laser. In particular, a light source that generates laser light in the blue-violet region, namely, in the wavelength range of 350 to 430 nm, is preferred and the center wavelength of the laser light is more preferably about 405 nm. Specific examples of the light source include an indium gallium nitride semiconductor laser that emits light of 405 nm. Examples of the scanning exposure method with a laser light source include, but are not limited to, a plane scanning exposure method, an external-drum scanning exposure method, and an internal-drum scanning exposure method. The scanning exposure is performed under the following scanning exposure conditions: the output light intensity of the laser is preferably 1 to 100 mW, and more preferably 3 to 70 mW; the emission wavelength is preferably 390 to 430 nm, and more preferably 400 to 420 nm; the beam spot diameter is preferably 2 to 30 μm, and more preferably 4 to 20 μm; the scan rate is preferably 50 to 500 m/sec, and more preferably 100 to 400 m/sec; and the scan density is preferably 2,000 dpi or more, and more preferably 4,000 dpi or more.

Next, an unexposed part, namely, an uncured part, is removed by using an organic solvent developer. The organic solvent developer is any developer that can dissolve the unexposed part and can be appropriately selected from publicly known organic solvents. Specific examples of the organic solvents include polar solvents, such as ketone solvents, ester solvents, alcohol solvents, amide solvents, and ether solvents; and hydrocarbon solvents.

[Nanoimprint Method]

A patterning method of the present invention is a pattern transfer method including:

a step of pressing a mold against a curable resin composition for a dry-etching resist, the curable resin composition containing the polymer (A);

a step of providing a cured product having a pattern by curing the curable resin composition for a dry-etching resist to form the pattern; and a step of transferring the pattern to a workpiece by performing dry etching using as a resist mask the obtained cured product having the pattern.

In the case of patterning using a mold, the resist film can be patterned by bringing a patterned mold in press-contact with a film formed by the foregoing method, and curing the curable resin composition for a dry-etching resist in this state. The curable resin composition for a dry-etching resist according to the present invention can also be preferably used particularly for nanoimprinting by which patterns of 100 nm or less can be formed.

Nanoimprinting is a technique of transferring the unevenness of a nanoimprint mold, which has a predetermined fine uneven pattern formed by electron-beam lithography or the like in advance, to a resist film on a substrate coated with a resist by pressing the nanoimprint mold against the substrate. Nanoimprinting is characterized in that the time per process, for example, for a region of one square inch or more is much shorter than that in a laser direct writing method.

In the step of pressing the nanoimprint mold having an uneven structure, specifically, the resist film formed of the curable resin composition for a dry-etching resist is forced into the fine details of the mold while the nanoimprint mold is pressed. At this time, the nanoimprint mold can also be pressed while the curable resin composition for a dry-etching resist is heated to reduce its viscosity such that the curable resin composition for a dry-etching resist more easily conforms to the fine details of the mold. Subsequently, the resist film formed of the curable resin composition for a dry-etching resist is cured by irradiation with ultraviolet rays, and the nanoimprint mold is then removed. As a result, a pattern can be obtained such that the fine details formed in the nanoimprint mold are transferred to the surface of the resist film formed of the curable resin composition for a dry-etching resist.

Specifically, the nanoimprint mold is brought into press-contact with the resist film formed of the curable resin composition for a dry-etching resist provided on the surface of the substrate such that the resist film is sandwiched between the substrate and the nanoimprint mold. It is also preferred that the nanoimprint mold be brought into contact with the resist film by a method, such as an up-down press method for a plate-shaped original template so as to conform to a roll process, a lamination method for a belt-shaped original template, a roll transfer method for a rolled original template, or a roll transfer method for a roll belt-shaped original template, each of which is a method for efficiently producing a molded material having a large area. Examples of the material of the nanoimprint mold include light transmitting materials, for example, quartz glass, ultraviolet transmitting glass, sapphire, diamond, silicon materials such as polydimethylsiloxane, fluororesins, and other light transmitting resin materials. When the substrate used is made of a light transmitting material, the nanoimprint mold may be made of a material that does not transmit light. Examples of the material that does not transmit light include metals, silicon, SiC, and mica.

The nanoimprint mold may have any shape, such as a plate shape, a belt shape, a roll shape, or a roll belt shape, as described above. The release treatment known in the related art is preferably performed on the transfer surface in order to, for example, avoid contamination of the original template due to floating dust or the like.

(Curing Process)

Examples of the curing method include the following methods: when the mold is made of a light transmitting material, a method for irradiation with light from the mold side; and when the substrate is made of a light transmitting material, a method for irradiation with light from the substrate side. The light used for photoirradiation is any light to which the photopolymerization initiator is sensitive. In particular, light having a wavelength of 450 nm or less (active energy rays, such as ultraviolet rays, X-rays, and γ-rays) is preferred because the photopolymerization initiator is highly sensitive to such light and enables curing with such light at a low temperature. Light having a wavelength of 200 to 450 nm is particularly preferred from the standpoint of operability. Specifically, the light used during ultraviolet curing as mentioned above can be used.

When there is a problem related to the conformability of a pattern to be formed, the curable resin composition for a dry-etching resist may be heated to a temperature at which sufficient flowability is obtained during photoirradiation. The temperature in the case of heating is preferably 300° C. or less, more preferably 0° C. to 200° C., still more preferably 0° C. to 150° C., and particularly preferably 25° C. to 80° C. In this temperature range, the precision of the fine pattern details formed in the resist film formed of the curable resin composition for a dry-etching resist is maintained high.

In addition to the foregoing methods, a curing method involving a method for performing transporting in a reactor so as to conform to a roll process is also preferred as a method for efficiently producing a molded material having a large area.

(Release Process)

After the curing process, the molded material is removed from the mold, and thus a resist film is obtained such that an uneven pattern transferred from the uneven pattern of the mold is formed on the surface of the cured product of the resist film formed of the curable resin composition for a dry-etching resist. In order to suppress deformation, such as curling, of the substrate and to improve the precision of the uneven pattern, the temperature of the release process is preferably as follows: the release process is performed after the resist film is cooled to about room temperature (25° C.); or even when the release process is performed with the resist film still heated, the resist film is cooled to about room temperature (25° C.) with a certain tension applied to the resist film.

[Dry-Etching Resist]

When a stacked product having a resist film that has a pattern formed by the method described above is dry-etched, the pattern can be formed well in the substrate, and a patterned product to which the pattern is transferred by dry etching can be obtained.

Since the resist film formed of the curable resin composition for a dry-etching resist according to the present invention has good dry-etching resistance, a fine etching pattern can be obtained without damaging the pattern and the like during the etching. This allows the pattern formed in the resist to be precisely transferred to the substrate and accordingly a patterned product is provided with high pattern reproducibility.

Examples of gas to be used for dry etching include publicly known gases, for example, oxygen-atom-containing gases, such as oxygen, carbon monoxide, and carbon dioxide; inert gases, such as helium, nitrogen, and argon; chlorine-containing gases, such as chlorine and boron trichloride; fluorine-containing gases; hydrogen gas; and ammonia gas. These gases may be used alone or in a mixture as appropriate.

A desired pattern can be formed on the substrate by dry etching using a plasma of such a gas.

EXAMPLES

Next, the present invention will be specifically described by way of Examples and Comparative Examples. Unless otherwise specified, the units "part" and "%" are based on the weight in Examples and Comparative Examples.

Although the present invention will be more specifically described below by way of Examples and Comparative Examples, the present invention is not limited to these Examples.

Synthesis Example 1

Synthesis of 1,4-divinylbenzene

In a nitrogen atmosphere, methylenetriphenylphosphorane was prepared by reaction between methyltriphenylphosphonium bromide (29.1 g, 81.1 mmol) and potassium tert-butoxide (9.88 g, 88.1 mmol) at 0° C. and was dissolved in tetrahydrofuran (40 mL). A solution of 4-formylstyrene (9.30 g, 70.5 mmol) in tetrahydrofuran (60 mL) was added dropwise to the resulting solution. The mixture was allowed to react while stirring at 25° C. for 2 hours, and the reaction was then deactivated by addition of water. The aqueous phase was removed from the reaction solution by liquid-liquid extraction using diethyl ether. After the organic phase was dried over magnesium sulfate, magnesium sulfate was removed by filtering. The organic phase was concentrated by evaporation and added to hexane to precipitate triphenylphosphine oxide. After triphenylphosphine oxide was removed by filtering, the solvent was removed by evaporation, followed by purification by silica gel column chromatography using a hexane solvent and subsequent vacuum fractionation. As a result, 6.07 g of 1,4-divinylbenzene was obtained (yield 66%). The determination by gas chromatography showed that the purity of 1,4-divinylbenzene was 99% or more.

The physical properties of the obtained polymer are as follows:

$^1$H-NMR (600 MHz, CDCl$_3$) δ (ppm): 7.32 (s, 4H), 6.66 (dd, 2H), 5.70 (d, 2H), 5.19 (d, 2H), Synthesis Example 2

Synthesis of Polymer (A-1)

In a nitrogen atmosphere, a solution of sec-butyllithium (0.0776 mmol) in tetrahydrofuran (6.60 ml) was added to α-methylstyrene (0.311 mmol), and the mixture was allowed to react at 25° C. for 10 seconds and further allowed to react at −78° C. for 30 minutes. To the mixture, a solution of potassium tert-butoxide (0.932 mmol) in tetrahydrofuran (17.8 mL) was added at −78° C. to provide an initiator solution.

In a nitrogen atmosphere, a solution of 1,4-divinylbenzene (1.56 mmol), which was obtained in Synthesis Example 1, in tetrahydrofuran (11.6 mL) was cooled to −78° C., and the initiator solution was added to this solution and stirred for 1 minute. Subsequently, the reaction was deactivated by addition of degassed methanol. This solution was added to 200 mL of methanol to form a precipitate. The precipitate was collected, and further precipitation for purification using tetrahydrofuran and methanol was repeated twice. As a result, 0.23 g of a nearly white polymer (A-1) was obtained (yield 93%). The determination of the obtained polymer (A-1) by gas chromatography showed that monomers did not remain. As a result of the $^1$H-NMR measurement, the peaks attributable to the vinyl group appeared near 6.7 ppm, 5.6 ppm, and 5.1 ppm, the peak attributable to the aromatic structure appeared near 7.3 ppm, and the peak attributable to the main chain —$CH_2$—CH— appeared from 0.80 to 0.00 ppm. These results indicate that the polymer (A-1) is a polymer in which the aromatic structure having the vinyl group and located in the side chain is linked to the main chain via a single bond, and hence this polymer corresponds to the polymer (A) of the present invention.

The physical properties of the obtained polymer (A-1) are as follows:

$^1$H-NMR (600 MHz, $CDCl_3$) δ (ppm): 7.3 to 6.0 (m), 5.61 (br), 5.13 (br), 3.0 to 0.80 (m), 0.80 to 0.00 (m)

GPC (THF) polystyrene equivalent number-average molecular weight 3,080, Mw/Mn=1.04

Synthesis Example 3

Synthesis of Polymer (A-2)

In a nitrogen atmosphere, a solution of sec-butyllithium (0.776 mmol) in tetrahydrofuran (13.2 ml) and a solution of lithium chloride (18.63 mmol) in tetrahydrofuran (35.6 mL) were mixed at −78° C. to provide an initiator solution.

In a nitrogen atmosphere, a solution of 1,4-divinylbenzene (2.33 mmol), which was obtained in Synthesis Example 1, in tetrahydrofuran (23.2 mL) was cooled to −78° C., and the initiator solution was added to this solution and stirred for 1 minute. Subsequently, the reaction was deactivated by addition of degassed methanol. This solution was added to 200 mL of methanol to form a precipitate. The precipitate was collected, and further precipitation for purification using tetrahydrofuran and methanol was repeated twice. As a result, 0.15 g of a nearly white polymer (A-2) was obtained (yield 42%). The determination of the obtained polymer (A-2) by gas chromatography showed that monomers did not remain. As a result of the $^1$H-NMR measurement, the peaks attributable to the vinyl group appeared near 6.7 ppm, 5.6 ppm, and 5.1 ppm, the peak attributable to the aromatic structure appeared near 7.3 ppm, and the peak attributable to the main chain —$CH_2$—CH— appeared from 0.80 to 0.00 ppm. These results indicate that the polymer (A-2) is a polymer in which the aromatic structure having the vinyl group and located in the side chain is linked to the main chain via a single bond, and hence this polymer corresponds to the polymer (A) of the present invention.

The physical properties of the obtained polymer (A-1) are as follows:

$^1$H-NMR (600 MHz, $CDCl_3$) δ (ppm): 7.3 to 6.0 (m), 5.7 to 5.5 (m), 5.3 to 5.1 (m), 3.0 to 0.80 (m), 0.80 to 0.00 (m)
GPC (THF) polystyrene equivalent number-average molecular weight 400, Mw/Mn=2.04

Synthesis Example 4

Synthesis of Comparative Polymer 1

In a nitrogen atmosphere, a solution of sec-butyllithium (0.776 mmol) in tetrahydrofuran (13.2 ml) was added to α-methylstyrene (1.55 mmol), and the mixture was allowed to react at 25° C. for 10 seconds and further allowed react at −78° C. for 30 minutes. To the mixture, a solution of potassium tert-butoxide (9.32 mmol) in tetrahydrofuran (35.6 mL) was added at −78° C. to provide an initiator solution.

In a nitrogen atmosphere, a solution of 1,4-divinylbenzene (1.56 mmol), which was obtained in Synthesis Example 1, in tetrahydrofuran (23.2 mL) was cooled to −78° C., and the initiator solution was added to this solution and stirred for 1 minute. Subsequently, the reaction was deactivated by addition of degassed methanol. This solution was added to 200 mL of methanol to form a precipitate. The precipitate was collected, and further precipitation for purification using tetrahydrofuran and methanol was repeated twice. As a result, 0.133 g of a nearly white comparative polymer 1 was obtained (yield 31%). The determination of the obtained comparative polymer 1 by gas chromatography showed that monomers did not remain. As a result of the $^1$H-NMR measurement, the peaks attributable to the vinyl group appeared near 6.7 ppm, 5.6 ppm, and 5.1 ppm, the peak attributable to the aromatic structure appeared near 7.3 ppm, and the peak attributable to the main chain —$CH_2$—CH— appeared from 0.80 to 0.00 ppm. These results indicate that the comparative polymer 1 is a polymer in which the aromatic structure having the vinyl group and located in the side chain is linked to the main chain via a single bond, but the comparative polymer 1 has only two structural units represented by X1 and hence does not correspond to the polymer (A) of the present invention.

The physical properties of the obtained comparative polymer 1 are as follows:

$^1$H-NMR (600 MHz, $CDCl_3$) δ (ppm): 7.3 to 6.0 (m), 55.7 to 5.5 (m), 5.3 to 5.1 (m), 3.0 to 0.80 (m), 0.80 to 0.00 (m)

GPC (THF) polystyrene equivalent number-average molecular weight 500, Mw/Mn=1.05

Synthesis Example 5

Synthesis of Comparative Polymer 2

In a nitrogen atmosphere, a solution of styrene (2.33 mmol) in tetrahydrofuran (11.6 mL) was cooled to −78° C. To the solution, a solution of sec-butyllithium (0.0776 mmol) in tetrahydrofuran (6.60 ml) was added and stirred for 1 minute. Subsequently, the reaction was deactivated by addition of degassed methanol. This solution was added to 200 mL of methanol to form a precipitate. The precipitate was collected, and further precipitation for purification using tetrahydrofuran and methanol was repeated twice. As a result, 0.23 g of a nearly white comparative polymer 2 was obtained (yield 95%). Based on the results of the $^1$H-NMR measurement, no peak attributable to the vinyl group appeared and the peak attributable to the aromatic structure appeared near 7.3 ppm, and the peak attributable to the main chain —$CH_2$—CH— appeared from 0.80 to 0.00 ppm. The results indicate that the comparative polymer 2 is a polystyrene having no vinyl group in the side chain and does not correspond to the polymer (A) of the present invention. The physical properties of the obtained comparative polymer 2 are as follows:

$^1$H-NMR (600 MHz, $CDCl_3$) δ (ppm): 7.3 to 6.0 (m), 3.0 to 0.80 (m), 0.80 to 0.00 (m)

GPC (THF) polystyrene equivalent number-average molecular weight 3,100, Mw/Mn=1.04

Synthesis Example 6

Synthesis of Polymerizable Monomer (B-1)

<Synthesis of Chloro Intermediate>

To a 5 L four-necked flask equipped with a stirrer, a condenser, a thermometer, and a chlorine-gas introducing device, were added 709 g of biphenyl, 276 g of paraformaldehyde, 1381 g of acetic acid, and 958 g of concentrated hydrochloric acid. The mixture was heated to 80° C. After the prepared solution was determined to have a temperature of 80° C., hydrogen chloride gas was introduced to the prepared solution at a rate of 20 g/hr by using a Kinoshita glass ball filter. After the hydrogen chloride gas was determined to be dissolved in the prepared solution until saturation, 1061 g of phosphoric acid was added dropwise to the prepared solution over 1 hour, and furthermore the mixture was allowed to react for 30 hours. After completion of the reaction, the lower phase was immediately removed from the reaction solution, 2.3 kg of toluene was added to the organic phase, and the organic phase was washed with 400 g of a 12.5% aqueous solution of sodium hydroxide, a saturated aqueous solution of sodium hydrogen carbonate, and distilled water. After the organic phase was removed by distillation, 900 g of a chloro intermediate was obtained as a white solid.

<Acryloylation>

The intermediate (908 g) was dissolved in 1603 g of dimethylformamide (DMF), which was a reaction solvent. To the solution, 372 g of potassium carbonate was added and p-methoxyphenol was added at 300 ppm based on the total amount. After the solution of the intermediate was heated to 40° C., 323 g of acrylic acid was added dropwise to the solution of the intermediate over 1.5 hours. After completion of the dropwise addition, the mixture was heated to 80° C. over 2 hours, and was stirred under heating at 80° C. for 3 hours. To the obtained solution, 3.4 kg of water and 1.8 kg of toluene were added, followed by extraction. The organic phase was then washed until neutral. The organic phase was then concentrated and 995 g of a polymerizable monomer (B-1) was obtained. The polymerizable monomer (B-1) was liquid at 25° C.

The polymerizable monomer (B-1) obtained above was subjected to gas chromatography analysis under the following conditions.

Device: "6850 Series" available from Agilent Technologies
Column: Agilent DB-1
Carrier gas: He, flow rate 1 mL/min
Injection temperature: 300° C.
Detection temperature: 300° C.
Program: 50° C. to 325° C. (heating rate 25° C./min)

The composition ratio was obtained from the gas chromatogram and found to be 71.0% of monofunctional acrylates, 20.2% of bifunctional acrylates, and 8.8% of others.

Examples 1 to 4, Comparative Examples 1 to 4

The components were mixed based on the composition table shown in Table 1 described below, and 3 parts by weight of 2-benzyl-2-dimethylamino-1-(4-morpholinophenyl)-1-butanone (Irgacure-369: available from BASF) was added as a photopolymerization initiator to provide curable compositions.

TABLE 1

| | Polymer (A) | Comparative polymer | Polymerizable monomer (B) | Amount of (a-1) in polymer (A) | Milliequivalent of vinyl group in polymer (A) (meq/g) | m | n | m/(m + n) | Ohnishi parameter of composition |
|---|---|---|---|---|---|---|---|---|---|
| Example 1 | Polymer (A-1) (100 parts by weight) | | | 98 wt % | 7.37 | 20 | 4 | 0.83 | 2.0 |
| Example 2 | Polymer (A-1) (50 parts by weight) | | Polymerizable monomer (B-1) (50 parts by weight) | 98 wt % | 7.37 | 20 | 4 | 0.83 | 2.2 |
| Example 3 | Polymer (A-2) (100 parts by weight) | | | 87 wt % | 7.69 | 3 | 0 | 1 | 2.2 |
| Example 4 | Polymer (A-2) (50 parts by weight) | | Polymerizable monomer (B-1) (50 parts by weight) | 87 wt % | 7.69 | 3 | 0 | 1 | 2.2 |
| Comparative Example 1 | | | 1,4-Divinylbenzene (100 parts by weight) | — | — | — | — | — | 2.0 |
| Comparative Example 2 | | Comparative polymer 1 (100 parts by weight) | | 47 wt % | 3.60 | 2 | 2 | 0.5 | 2.0 |
| Comparative Example 3 | | | Polymerizable monomer (B-1) (100 parts by weight) | — | — | — | — | — | 2.3 |
| Comparative Example 4 | | Comparative polymer 2 (100 parts by weight) | | 99 wt % | 0 | 0 | 30 | 0 | 2.0 |

<Method for Evaluating Dry-Etching Resistance>

(Preparation of Resist Film)

The compositions according to Examples 1 to 4 and Comparative Examples 1 to 4 were each diluted with a methyl isobutyl ketone solvent, and applied to a silicon wafer substrate so as to have a film thickness of 1.0 μm by spin coating. The resultant stacked product was irradiated with light at a light dose of 1000 mJ/cm$^2$ from the resin composition side in a nitrogen atmosphere by using a LED light source (available from USHIO, INC.) with a peak wavelength of 375±5 nm, so that the resin composition was cured to provide a cured film.

(Dry Etching Method Using Fluorine-Containing Gas)

The obtained cured film was subjected to plasma dry etching for 1 minute under a vacuum of 0.5 Pa by using a dry etcher RIE-101iPH available from SAMCO Inc. with supply of mixed gas at Argon/$CF_4$ of 30/10 (sccm). Then, the residual film thickness of the cured film was determined and the etching rate per minute was determined.

(Dry Etching Method Using Chlorine-Containing Gas)

The obtained cured film was subjected to plasma dry etching for 1 minute under a vacuum of 0.5 Pa by using a dry etcher RIE-101iPH available from SAMCO Inc. with supply of mixed gas at Argon/$Cl_2$/$BCl_3$ of 20/15/20. Then, the residual film thickness of the cured film was determined and the etching rate per minute was determined.

(Evaluation Criteria)

The obtained etching rate was normalized such that the etching rate of a cresol novolac-based photoresist (AZ-5214, AZ Electronic Materials plc) was 1. A smaller normalized etching rate indicates better dry-etching resistance. The normalized etching rate was rated as follows.

A: The normalized etching rate is less than 0.8.

B: The normalized etching rate is 0.8 or more and less than 1.

C: The normalized etching rate is 1 or more.

<Method for Evaluating Curability>

The curable compositions prepared in Examples 1 to 4 and Comparative Examples 1 to 4 were each diluted with a methyl isobutyl ketone solvent, and applied to a glass substrate at a film thickness of 3.0 μm by spin coating. The resultant stacked product was irradiated with light at a light dose of 1000 mJ/$cm^2$ from the resin composition side in a nitrogen atmosphere by using a LED light source (available from USHIO, INC.) with a peak wavelength of 375±5 nm, so that the resin composition was cured to provide a cured film. The surface of the obtained cured film was scrubbed 10 times with a swab impregnated with an isopropyl alcohol solvent, and the change in the appearance of the cured film was observed. A fewer change in the appearance of the cured film indicates that the crosslinking reaction due to the reaction of the vinyl group has proceeded, the elution into the solvent is less likely to occur, and the curability is better.

A: No change in appearance is observed.

C: The substrate is exposed as a result of scrubbing.

<Evaluation of Imprint Pattern Formability>

—Line Pattern Formability—

The curable compositions prepared in Examples 1 to 4 and Comparative Examples 1 to 4 were each diluted with a methyl isobutyl ketone solvent, and applied to a silicon wafer substrate at a film thickness of 300 nm by spin coating. The resultant stacked product was placed on the lower stage of a nanoimprinting device X300 available from SCIVAX Corporation. A mold having a 100-nm line/space pattern, having a groove depth of 100 nm, made of quartz, and having the patterned surface coated with a fluorine-containing material was placed on the upper stage of the device. After the space in the device was evacuated, the mold was pressed against the substrate at a pressure of 1.5 atm at room temperature or at a temperature equal to or higher than the melting temperature of the coating film. This was exposed to light at 500 mJ/$cm^2$ from the back surface of the mold by using a LED light source with a peak wavelength of 375±5 nm. The mold was removed and, as a result, a pattern was formed on the substrate. Scanning electron microscopic observation of the line-patterned cross section and dark-field optical microscopic observation from the pattern upper surface were carried out, and the pattern formability was rated as follows.

(Pattern Profile)

In the cross-sectional observation of the pattern by scanning electron microscopic observation, A: No pattern missing or pattern collapse is observed.

C: Pattern missing and pattern collapse are observed on a part of the surface or over the entire surface.

(Pattern Defect Percentage)

In the dark-field optical microscopic observation in the visual field of a 100-μm square from the pattern upper surface, A: The area of the pattern defect observed as bright dots is less than 5%.

C: The area of the pattern defect observed as bright dots is 5% or more.

—Pillar Pattern Formability—

The curable compositions prepared in Examples 1 to 4 and Comparative Examples 1 to 4 were each diluted with a methyl isobutyl ketone solvent and optionally with a surface modifier, such as a wetting agent, and applied to a silicon wafer substrate at a film thickness of 500 nm by spin coating. The resultant stacked product was placed on the lower stage of a nanoimprinting device X300 available from SCIVAX Corporation. A mold having a pattern of a triangular array of holes with a pitch of 460 nm, having a groove depth of 450 nm, and made of a cycloolefin polymer (ZEONOR ZF-14 available from Zeon Corporation) was placed on the upper stage of the device. After the space in the device was evacuated, the mold was pressed against the substrate at a pressure of 1.5 atm at room temperature or at a temperature equal to or higher than the melting temperature of the coating film. This was exposed to light at 500 mJ/$cm^2$ from the back surface of the mold by using a LED light source with a peak wavelength of 375±5 nm. The mold was removed and, as a result, a pattern was formed on the substrate. Scanning electron microscopic observation of the pillar-patterned cross section and dark-field optical microscopic observation from the pattern upper surface were carried out, and the pattern formability was rated in the same manner as that described above.

TABLE 2

| | Fluorine-containing gas | Chlorine-containing gas | | | Line pattern formability by nanoimprinting | | Pillar pattern formability by nanoimprinting | |
|---|---|---|---|---|---|---|---|---|
| | Dry-etching resistance | Dry-etching resistance | Curability | Pattern profile | Pattern defect percentage | Pattern profile | Pattern defect percentage | |
| Example 1 | A | A | A | A | A | A | A | |
| Example 2 | A | A | A | A | A | A | A | |
| Example 3 | A | A | A | A | A | A | A | |
| Example 4 | A | A | A | A | A | A | A | |

TABLE 2-continued

| | Fluorine-containing gas | Chlorine-containing gas | | Line pattern formability by nanoimprinting | | Pillar pattern formability by nanoimprinting | |
| --- | --- | --- | --- | --- | --- | --- | --- |
| | Dry-etching resistance | Dry-etching resistance | Curability | Pattern profile | Pattern defect percentage | Pattern profile | Pattern defect percentage |
| Comparative Example 1 | Not evaluated because not solidified | Not evaluated because not solidified | C | Not solidified | Not solidified | Not solidified | Not solidified |
| Comparative Example 2 | B | B | C | C | C | C | C |
| Comparative Example 3 | C | C | A | A | A | A | A |
| Comparative Example 4 | A | A | C | Interfacially stripped over entire surface | Interfacially stripped over entire surface | Interfacially stripped over entire surface | Interfacially stripped over entire surface |

Table 2 shows that the cured products formed by using the curable compositions of the present invention had good dry-etching resistance, good curability, and good pattern formability. The composition of Comparative Example 1 contains a 1,4-divinylbenzene monomer but this monomer had only two vinyl groups in the molecule thereof. Consequently, the composition of Comparative Example 1 was not cured into a cured product by photoirradiation. The composition of Comparative Example 2 contains a polymer having vinyl groups in the molecular side chain but the polymer has only two vinyl groups. Consequently, the cured product obtained by photoirradiation of the composition of Comparative Example 2 had poor curability and poor pattern formability and also had insufficient dry-etching resistance. The composition of Comparative Example 3 contains no polymer (A) and includes only a polymerizable monomer containing an oxygen atom, so that the dry-etching resistance was poor. The composition of Comparative Example 4 contains a polymer having no vinyl group and thus was not cured by photoirradiation.

INDUSTRIAL APPLICABILITY

The curable resin composition of the present invention provides good dry etching performance and precise pattern reproducibility and accordingly can be preferably used as a dry-etching resist material.

The invention claimed is:

1. A pattern transfer method comprising:
   a step of pressing a mold against a curable resin composition for a dry-etching resist, the curable resin composition comprising a polymer (A) having a structure represented by a formula (a-1) below, the polymer (A) including 80 to 100 wt % of the structure represented by the formula (a-1),

[Chem. 1]

   (a-1), in the formula (a-1), X is a structural unit represented by X1 and X2, X1 is represented by a formula (a-2) below, and X2 is represented by a formula (a-3) below, wherein the number of X1 is m and the number of X2 is n in the polymer (A), m is an integer of 3 or more, n is an integer of 0 or 1 or more, and m/(m+n) ranges from 0.2 to 1, and p represents an integer of 3 to 2000,

in the formula (a-2), $Ar_1$ represents an aromatic group having at least one aromatic ring, $Y_1$ is a single bond or a divalent linking group including a C1 to C3 hydrocarbon group, $Z_1$ is a hydrocarbon group having at least one vinyl group, and r1 represents an integer of 1 to 5,

in the formula (a-3), $Ar_2$ represents an aromatic group having at least one aromatic ring, and $Y_2$ is a single bond or a divalent linking group including a C1 to C3 hydrocarbon group;

a step of providing a cured product having a pattern by curing the curable resin composition for a dry-etching resist to form the pattern; and a step of transferring the pattern to a workpiece by performing dry etching using as a resist mask the obtained cured product having the pattern.

2. A pattern transfer method according to claim 1, wherein X1 in the formula (a-1) is represented by a formula (a-4) below,

in the formula (a-4), $Y_3$ is a single bond or a divalent linking group including a C1 to C3 hydrocarbon group, $Z_2$ is a hydrocarbon group having at least one vinyl group, and r2 represents an integer of 1 to 5.

3. A nanoimprint method comprising:

a step of pressing a mold against a curable resin composition for a dry-etching resist, the curable resin composition comprising a polymer (A) having a structure represented by a formula (a-1) below, the polymer (A) including 80 to 100 wt % of the structure represented by the formula (a-1),

[Chem. 1]

$$\text{---}(\text{X})_p\text{---} \quad (a\text{-}1),$$

in the formula (a-1), X is a structural unit represented by X1 and X2, X1 is represented by a formula (a-2) below, and X2 is represented by a formula (a-3) below, wherein the number of X1 is m and the number of X2 is n in the polymer (A), m is an integer of 3 or more, n is an integer of 0 or 1 or more, and m/(m+n) ranges from 0.2 to 1, and p represents an integer of 3 to 2000, (a-2)

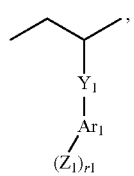

in the formula (a-2), $Ar_1$ represents an aromatic group having at least one aromatic ring, $Y_1$ is a single bond or a divalent linking group including a C1 to C3 hydrocarbon group, $Z_1$ is a hydrocarbon group having at least one vinyl group, and r1 represents an integer of 1 to 5, (a-3)

in the formula (a-3), $Ar_2$ represents an aromatic group having at least one aromatic ring, and $Y_2$ is a single bond or a divalent linking group including a C1 to C3 hydrocarbon group, wherein the mode is a nanoimprinting mode;

a step of providing a cured product having a pattern by curing the curable resin composition for a dry-etching resist to form the pattern; and a step of transferring the pattern to a workpiece by performing dry etching using as a resist mask the obtained cured product having the pattern.

4. A nanoimprint method according claim 3, wherein the step of pressing a mold against the curable resin composition for a dry-etching resist is performed while the curable resin composition for a dry-etching resist is heated.

* * * * *